United States Patent
Lai et al.

(10) Patent No.: US 10,181,583 B2
(45) Date of Patent: Jan. 15, 2019

(54) ORGANIC LIGHT-EMITTING DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Weilin Lai, Beijing (CN); Renrong Gai, Beijing (CN); Xiaojin Zhang, Beijing (CN); Minghua Xuan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 27 days.

(21) Appl. No.: 15/117,563

(22) PCT Filed: Jan. 20, 2016

(86) PCT No.: PCT/CN2016/071471
§ 371 (c)(1),
(2) Date: Aug. 9, 2016

(87) PCT Pub. No.: WO2017/008487
PCT Pub. Date: Jan. 19, 2017

(65) Prior Publication Data
US 2017/0162829 A1    Jun. 8, 2017

(30) Foreign Application Priority Data
Jul. 15, 2015 (CN) .......................... 2015 1 0415378

(51) Int. Cl.
H01L 51/52     (2006.01)
H01L 27/32     (2006.01)
H01L 51/50     (2006.01)

(52) U.S. Cl.
CPC ........ H01L 51/5278 (2013.01); H01L 27/322 (2013.01); H01L 51/504 (2013.01);
(Continued)

(58) Field of Classification Search
CPC ............ H01L 51/5278; H01L 127/322; H01L 51/5056; H01L 51/5072; H01L 51/5088;
(Continued)

(56) References Cited

U.S. PATENT DOCUMENTS 9,450,028 B2 *  9/2016  Chou .................. H01L 27/3211
2006/0152150 A1  7/2006  Boerner et al.
(Continued)

FOREIGN PATENT DOCUMENTS

CN    1543278 A    11/2004
CN    1685770 A    10/2005
(Continued)

OTHER PUBLICATIONS

International Search Report and Written Opinion dated Apr. 26, 2016; PCT/CN2016/071471.
(Continued)

Primary Examiner — Fernando L Toledo
Assistant Examiner — Neil Prasad
(74) Attorney, Agent, or Firm — Ladas & Parry LLP

(57) ABSTRACT

An organic light emitting device includes: a substrate (200), and a first electrode layer (201), a second electrode layer (202), a color conversion layer (206), a first light emitting layer (203), and a second light emitting layer (204) that are stacked on the substrate (200), wherein the first light emitting layer (203) is disposed between the first electrode layer
(Continued)

(201) and the second electrode layer (202), the first light emitting layer (203) emits the first emission light under electric excitation; the first electrode layer (201) is a transparent electrode layer, the first color conversion layer (206) is disposed at one side of the first electrode layer (201) away from the second electrode layer (202); the second light emitting layer (204) is disposed between the first light emitting layer (203) and the second electrode layer (202), the second light emitting layer (204) emits the second emission light under electric excitation; and a peak wavelength of the first emission light is larger than a peak wavelength of the first emission light in the blue light region.

15 Claims, 4 Drawing Sheets

(52) U.S. Cl.
CPC ...... H01L 51/5056 (2013.01); H01L 51/5072 (2013.01); H01L 51/5088 (2013.01); H01L 51/5092 (2013.01); H01L 51/5096 (2013.01); H01L 51/5218 (2013.01); H01L 51/5234 (2013.01); *H01L 2251/5315* (2013.01); *H01L 2251/558* (2013.01)

(58) Field of Classification Search
CPC ............. H01L 51/5092; H01L 51/5096; H01L 51/5218; H01L 51/5234; H01L 2251/5315; H01L 2251/558
See application file for complete search history.

(56) References Cited

U.S. PATENT DOCUMENTS

| | | |
|---|---|---|
| 2007/0164278 A1 | 7/2007 | Lee et al. |
| 2013/0082246 A1 | 4/2013 | Hasegawa |
| 2013/0320837 A1 | 12/2013 | Weaver et al. |
| 2014/0183496 A1* | 7/2014 | Heo .................... H01L 27/3209 257/40 |
| 2015/0188073 A1 | 7/2015 | Ahn et al. |
| 2015/0228697 A1 | 8/2015 | Liu et al. |

FOREIGN PATENT DOCUMENTS

| | | |
|---|---|---|
| CN | 101005119 A | 7/2007 |
| CN | 103077954 A | 5/2013 |
| CN | 203085547 U | 7/2013 |
| CN | 103474451 A | 12/2013 |
| CN | 104752623 A | 7/2015 |
| CN | 104979486 A | 10/2015 |
| KR | 1020090045681 A | 5/2009 |

OTHER PUBLICATIONS

First Chinese Office Action dated Aug. 30, 2016; Appln. No. 201510415378.2.

* cited by examiner

ORGANIC LIGHT-EMITTING DEVICE

TECHNICAL FIELD

Embodiments of the present disclosure relate to an organic light emitting device.

BACKGROUND

An organic light emitting diode (OLED) has the advantages of self luminous, high brightness, wide visual angle, quick response and red-green-blue full color components that can be manufactured, etc, so it is regarded as a promising product of the next generation of display devices. At present, the practical stage of OLED has arrived. Car audios and mobile phones employing OLED as display panels are available in the market. The application scope of future OLED is expected to extend to thin display markets such as mobile products, notebook computers, monitors, and wall-hanging television. The development of full color display will further enhance the competitiveness and market share of OLED products.

At present, the existing full color OLED technologies include the methods of pixel juxtaposition, color filter, micro cavity toning, multilayer stacking and color conversion, wherein the color conversion method uses the light emitted by the organic light emitting material as the excitation light, once again to stimulate the color conversion material to emit light such as red, green and blue, thus the purpose of full color is achieved. As the energy of blue light is the highest in the three colors of red, green and blue, the color conversion method usually uses the blue organic light emitting material as the main excitation light source body, as shown in FIG. 1.

SUMMARY

The present disclosure provides an organic light emitting device, which includes: a substrate, a first electrode layer, a second electrode layer, a first color conversion layer, a first light emitting layer and a second light emitting layer which are stacked on the substrate, wherein, the first light emitting layer is disposed between the first electrode layer and the second electrode layer, the first light emitting layer emits first emission light under electrical excitation; the first electrode layer is a transparent electrode layer, the first color conversion layer is disposed at one side of the first electrode layer away from the second electrode layer; the second light emitting layer is disposed between the first light emitting layer and the second electrode layer, the second light emitting layer emits second emission light under the electrical excitation; and the peak wavelength of the second emission light in the blue light region is larger than that of the first emission light in the blue light region.

In the organic light emitting device, for example, the first emission light and the second emission light are both blue light.

In the organic light emitting device, for example, the first emission light is blue light and the second emission light is white light.

In the organic light emitting device, for example, the first emission light is blue light, the second light emitting layer comprises two sub-layers, one of the sub-layers emits blue light, and the other sub-layer emits white light.

In the organic light emitting device, for example, a thickness of the first emitting layer is larger than a thickness of the second light emitting layer.

In the organic light emitting device, for example, further comprising a third light emitting layer and a second color conversion layer, wherein the second electrode layer is a transparent electrode layer, and the second color conversion layer is disposed at one side of the second electrode layer away from the first electrode layer; the third emitting layer is disposed between the second light emitting layer and the second electrode layer, the third light emitting layer emits third emission light under electric excitation, and the peak wavelength of the second emission light in the blue light region is larger than a peak wavelength of the third emission light in the blue light region.

In the organic light emitting device according, for example, the third emission light is blue light, the peak wavelength of the third emission light in the blue light region is approximately equal to the peak wavelength of the first emission light in the blue light region.

In the organic light emitting device, for example, the peak wavelength of the first emission light in the blue light region is from 420 nm to 470 nm, and the peak wavelength of the second emission light in the blue light region is from 450 nm to 500 nm.

In the organic light emitting device, for example, the peak wavelength of the first emission light in the blue light region is from 420 nm to 470 nm, the peak wavelength of the second emission light in the blue light region is from 450 nm to 500 nm, and the peak wavelength of the third emission light in the blue light region is from 420 nm to 470 nm.

In the organic light emitting device, for example, the second electrode layer is a reflective electrode layer, and the second electrode layer is disposed at one side closer to the substrate, the first electrode layer is disposed at one side away from the substrate.

In the organic light emitting device, for example, the second electrode layer is a reflective electrode layer, and the first electrode layer is disposed at one side closer to the substrate, the second electrode layer is disposed at one side away from the substrate.

In the organic light emitting device, for example, one of the first electrode layer and the second electrode layer comprises a first sub-pixel electrode and a second sub-pixel electrode that are disposed in a same layer, and the first color conversion layer is disposed in a region aligned to the first sub-pixel electrode.

In the organic light emitting device, for example, the first sub-pixel electrode further comprises a third sub-pixel electrode and a fourth sub-pixel electrode that are disposed in a same layer, the first color conversion layer comprises a first sub-color conversion layer and a second sub-color conversion layer that are disposed in a same layer, the first sub-color conversion layer is aligned to the third sub-pixel electrode, and the second sub-color conversion layer is aligned to the fourth sub-pixel electrode.

In the organic light emitting device, for example, the first sub-color conversion layer is a red conversion layer, and the second sub-color conversion layer is a green conversion layer.

In the organic light emitting device, for example, one of the first electrode layer and the second electrode layer comprises a first sub-pixel electrode and a second sub-pixel electrode that are disposed in a same layer, and the first color conversion layer and the second color conversion layer is disposed in a region aligned to the first sub-pixel electrode.

In the organic light emitting device, for example, the first sub-pixel electrode further comprises a third sub-pixel electrode and a fourth sub-pixel electrode that are disposed in a same layer, at least one of the first color conversion layer and the second color conversion layer comprises a first sub-color conversion layer and a second color conversion layer which are disposed in a same layer, the first sub-color conversion layer is aligned to the third sub-pixel electrode, and the second sub-color conversion layer is aligned to the fourth sub-pixel electrode.

In the organic light emitting device, for example, the first sub-color conversion layer is a red conversion layer, the second sub-color conversion layer is a green conversion layer.

In the organic light emitting device, for example, the organic light emitting device further comprises at least one layer disposed between the first electrode layer and the second electrode layer, the at least one layer is selected from a hole injection layer, a hole transport layer, a hole blocking layer, an electron transport layer, an electron injection layer and an electron blocking layer.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

Figure 1:
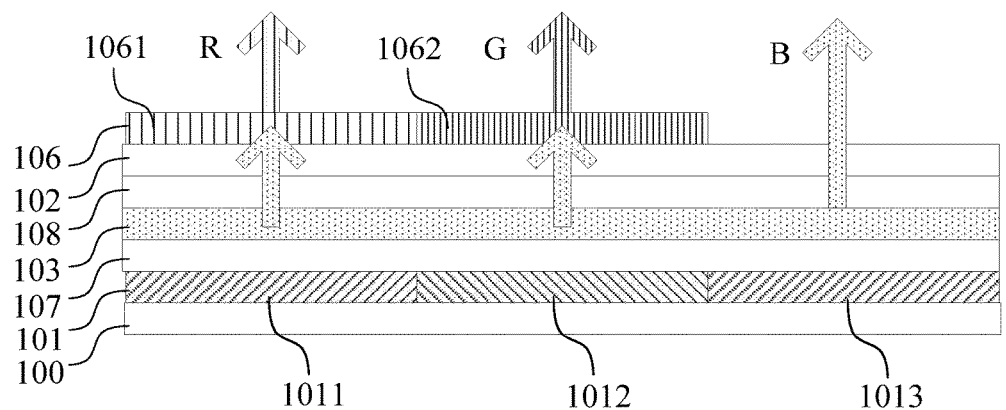
FIG. 1 is a schematic structure diagram of an OLED of conventional technology using the color conversion method to achieve a full color display.

REFERENCE NUMERALS 100, 200, 300—substrate; 101, 201—first electrode layer; 1011—first sub-pixel electrode; 1012—second sub-pixel electrode; 1013—third sub-pixel electrode; 102, 202—second electrode layer; 103—blue light-emitting layer; 106—color conversion layer; 1061—red conversion layer; 1062—green conversion layer; 107, 207—hole transport layer; 108, 208—electron transport layer; 206—first color conversion layer; 2061—first sub-color conversion layer; 2062—second sub-color conversion layer; 203—first light emitting layer; 204—second light emitting layer; 2021—first sub-pixel electrode; 20211—third sub-pixel electrode; 20212—forth sub pixel electrode; 2022—second sub pixel electrode; 209—hole injection layer; 210—electron injection layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly.

FIG. 1 shows an OLED structure of the conventional technology using the color conversion method to achieve a full color display. A first electrode layer 101 is disposed on a substrate 100. The first electrode layer 101 includes a first sub-pixel electrode 1011, a second sub-pixel electrode 1012 and a third sub-pixel electrode 1013 which are disposed at a same layer. Then, a hole transport layer 107, a blue light emitting layer 103, an electron transport layer 108, a second electrode layer 102 and a color conversion layer 106 are disposed on the first electrode layer 101 in sequence. The color conversion layer 106 includes a red conversion layer 1061 and a green conversion layer 1062 disposed at a same layer. The first electrode layer 101 is a reflective electrode, and the second electrode layer 102 is a transparent electrode, thus a top emission OLED device is formed. When an appropriate voltage is applied to the device, holes and electrons are recombined in the blue emitting layer 103 to emit blue light. Part of the blue light is converted into red light (R) and green light (G) by light conversion materials of the red conversion layer 1061 and the green conversion layer 1062 and then emits out, the rest blue light (B) emits out directly from the device, so as to achieve a full color display.

However, one problem in the above OLED structure is that the lifespan of the blue light emitting material is the shortest in all kinds of organic light emitting materials. For example, the lifespan of the blue light emitting material is obviously shorter than that of the red light emitting material or that of the green emitting material. It shortens the using life of the OLED with the above structure.

Figure 2:
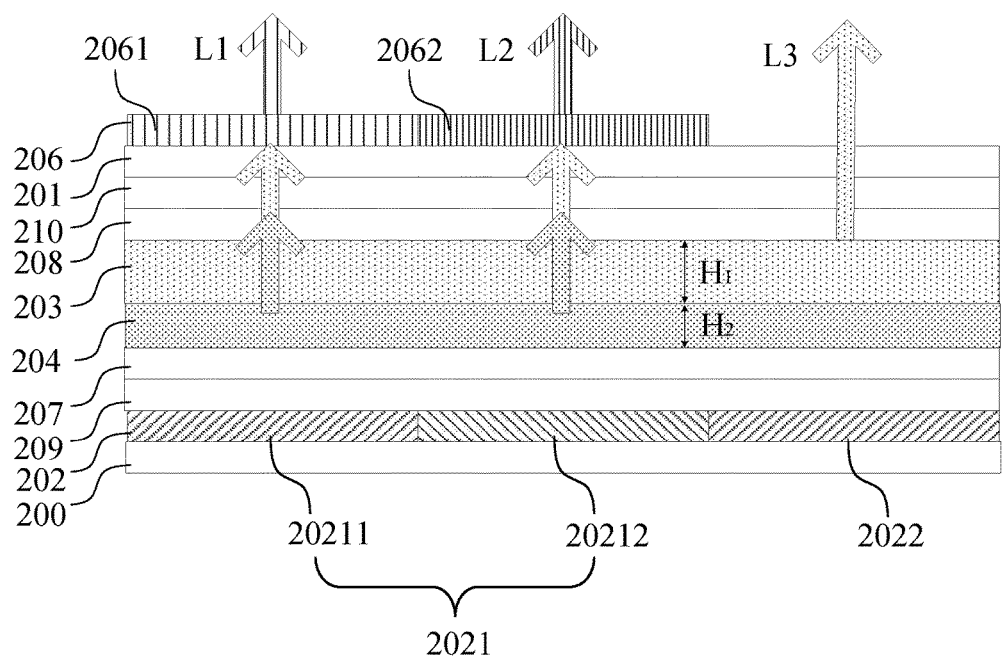
FIG. 2 is a schematic structure diagram of a top emission OLED with two light emitting layers provided by an embodiment of the present disclosure.

To solve this problem, one embodiment of the present disclosure improves the above scheme of the conventional technology. As shown in FIG. 2, an embodiment of the present disclosure provides an organic light emitting device, and the organic light emitting device comprises: a substrate 200, a first electrode layer 201, a second electrode layer 202, a first color conversion layer 206, a first light emitting layer 203 and a second light emitting layer 204, wherein the first electrode layer 201 is a transparent electrode layer, the first color conversion layer 206 is disposed at one side of the first electrode layer 201 away from the second electrode layer 202; the first light emitting layer 203 is disposed between the first electrode layer 201 and the second electrode layer 202, the first light emitting layer 203 emits first emission light under electrical excitation; the second light emitting layer 204 is disposed between the first light emitting layer 203 and the second electrode layer 202, the second light emitting layer 204 emits second emission light under electrical excitation; and a peak wavelength of the second emission light in the blue light region is larger than a peak wavelength of the first emission light in the blue light region.

It needs to be noted that, the first emission light and the second emission light are likely to be a monochromatic light or a composite light. In the case of monochromatic light (i.e. blue light), the peak wavelength is a wavelength corresponding to the highest point of the Gaussian peak in the light emitting spectrum; in the case of composite light, firstly the Gaussian function is used to fit it and to divide it into several Gaussian peaks (computer application programs can be used, such as Origin), the peak wavelength of the first emission light or the second emission light in the blue light region is a wavelength at the highest point of the Gaussian peak. What needs to be explained is that it is just an example to use the Gaussian function to fit and divide the spectrum of the composite light; other suitable methods can be used to fit and divide the spectrum.

The first emission light is generally a blue light with shorter wavelength, while the second emission light is generally a blue light with longer wavelength. The lifetime of the blue light emitting materials becomes longer as the wavelength of the emission light becomes longer. Therefore, the OLED device provided by the embodiment of the disclosure shows at least two advantages: 1) because there are two kinds of blue lights with two wavelengths as excitation light, the materials of the color conversion layer will be stimulated more fully so as to obtain a better luminous effect. It should be explained that the energy of the short wavelength blue light is higher, and it is disposed at a position close to the color conversion layer to guarantee to obtain a better luminous effect; 2) the second light emitting layer 204 has a longer lifetime, the device provided by the embodiment of the disclosure has a longer lifetime compared with the structure of the single light emitting layer of conventional technology.

Optional, the first emission light is blue light with shorter wavelength, while the second emission light is white light. The corresponding second light emitting layer 204 is a doping single layer which can emit white light, or a multi-layer stacked structure which can emit red, green and blue light respectively. White light is a composite light, which is generally compounded of lights with the three colors of red, green and blue. Through a computer application program, such as Origin to fit and divide the spectrum of the white light to obtain three monochromatic lights such as red, green and blue, wherein the peak wavelength of the blue light is larger than that of the first emission light. The second light emitting layer 204 will also have a longer lifetime so as to increase the lifetime of the OLED device.

Optional, as shown in FIG. 2, a thickness $H_1$ of the first light emitting layer 203 is larger than a thickness $H_2$ of the second light-emitting layer 204. Because the wavelength of the light emitted by the first light emitting layer 203 is shorter and the energy is higher, this setting can ensure the stimulating effect for the color conversion layer.

Optional, as shown in FIG. 2, the second electrode layer 202, for example, may include a first sub-pixel electrode 2021 and a second sub-pixel electrode 2022.

Optional, as shown in FIG. 2, the first color conversion layer 206 is disposed at a region aligned to the first sub-pixel electrode 2021. In other words, the projection of the first color conversion layer 206 on the substrate 200 is set as a projection (a), the projection of the first sub-pixel electrode 2021 on the substrate 200 is set as a projection (b), and the projection (a) is coincident with the projection (b).

Optional, as shown in FIG. 2, the first color conversion layer 206 includes two sub-color conversion layers which are respectively the first sub-color conversion layer 2061 and the second sub-color conversion layer 2062 disposed in a same layer.

Optional, as shown in FIG. 2, the first sub-pixel electrode 2021 further comprises a third sub-pixel electrode 20211 and a fourth sub-pixel electrode 20212. Although the sub-pixel electrodes 20211, 20212 and 2022 are shown to be connected together for convenience in FIG. 2, the sub-pixel electrodes can be electrically isolated from each other and can be driven independently.

Optional, the first sub-color conversion layer 2061 is aligned to the third sub-pixel electrode 20211, the second sub-color conversion layer 2062 is aligned to the fourth sub-pixel electrode 20212. That is to say, the first sub-color conversion layer 2061 is disposed at a region aligned to the third sub-pixel electrode 20211, the second color conversion layer 2062 is disposed at a region aligned to the fourth sub-pixel electrode 20212.

Optional, the first sub-color conversion layer 2061 is a red color conversion layer, the corresponding emission light L1 is red light. The second sub-color conversion layer 2062 is a green color conversion layer, the corresponding emission light L2 is green light. Of course, the first sub-color conversion layer 2061 and the second sub-color conversion layer 2062 can be color conversion layers with other colors, as long as they can emit light under the stimulation of at least one of the first emission light and the second emission light. The region aligned to the second sub-pixel electrode 2022 is not provided with any color conversion layers, the light emitted in the corresponding region is blue light. A thickness H1 of the first light emitting layer 203 is set greater than a thickness H2 of the second light-emitting layer 204. Through this setting, it can be ensured that when the second light emitting layer 204 emits white light, the emitting light from the region without any color conversion layer is blue light.

Optional, as shown in FIG. 2, the OLED device provided by the embodiment of the present disclosure further includes a hole injection layer 209 and a hole transport layer 207 that are sequentially disposed on the second electrode layer 202, and an electron transport layer 208 and an electron injection layer 210 that are sequentially disposed on the first light emitting layer 203. These layers are set according to the type of the first electrode and the second electrode. The hole injection layer and the hole transport layer can be disposed between the anode and the light emitting layer, the electron transport layer and the electron injection layer can be disposed between the light emitting layer and the cathode. FIG. 2 shows an example of a cascade structure, the sequence of the above layers can be adjusted according to the actual needs.

A certain voltage is applied between the first electrode layer 201 and the second electrode layer 202, then the first light emitting layer 203 emits blue light and the second light emitting layer 204 emits blue light or white light, the corresponding emission light irradiates the red conversion layer 2061 and the green conversion layer 2062 to emit red light and green light respectively, the region aligned to the second sub-pixel electrode 2022 emits blue light directly, the intensity of light in different colors can be controlled by adjusting the voltage on the pixel electrodes 20211, 20212 and 2022, thus a full color display can be achieved.

Figure 3:
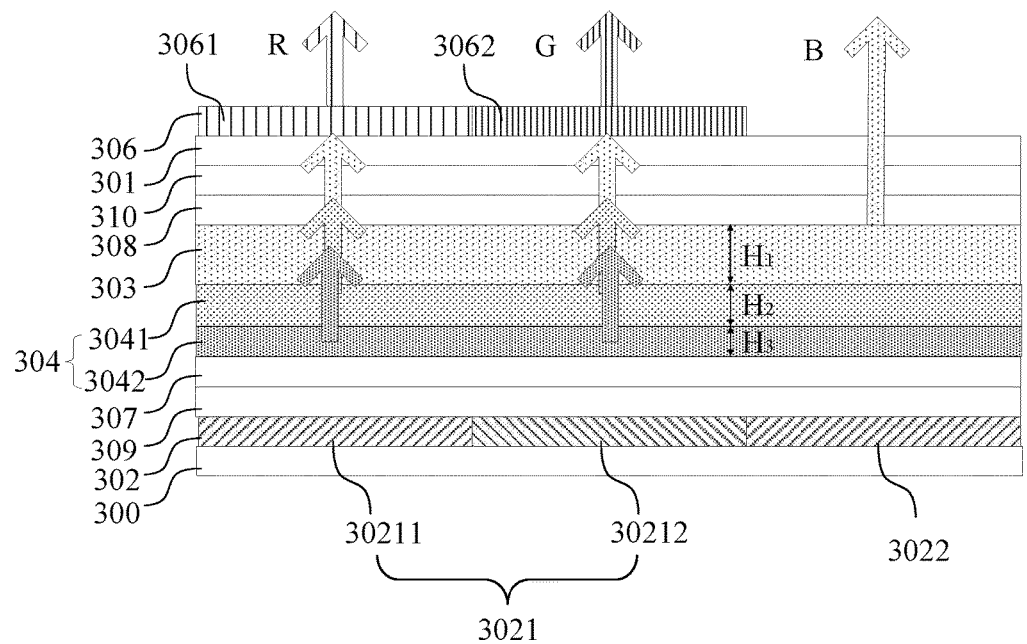
FIG. 3 is a schematic structure schematic diagram of a top emission OLED with two light emitting layers and the second light emitting layer having two sub-layers provided by an embodiment of the present disclosure.

FIG. 3 shows an OLED device provided by another embodiment of the present disclosure. The same structure shown in FIG. 2 and FIG. 3 will not be described for simplicity the same below. The OLED includes a substrate 300 and a second electrode layer 302, a hole injection layer 309, a hole transport layer 307, a second light emitting layer 304, a first light emitting layer 303, an electron transport layer 308, an electron injection layers 310, a first electrode layer 302 and a first color conversion layer 306 that are sequentially formed on the substrate 300.

Optional, as shown in FIG. 3, the second light emitting layer 304 further includes two sub-layers 3041 and 3042.

Optional, the first light emitting layer 303 emits blue light, the sub-layer 3041 emits blue light, and the sub-layer 3042 emits white light. The peak wavelength of the blue light emitted by the sub-layer 3041 is larger than that of the blue light emitted by the first light emitting layer 303. The peak wavelength of the white light emitted by the sub-layer 3042 in the blue light region is larger than that of the blue light emitted by the first light emitting layer 303.

Optional, as shown in FIG. 3, the second electrode layer 302 is a reflective electrode layer. The second electrode layer 302 includes a first sub-pixel electrode 3021 and a second sub-pixel electrode 3022.

Optional, as shown in FIG. 3, the first color conversion layer 306 is disposed at a region aligned to the first sub-pixel electrode 3021. In other words, the projection of the first color conversion layer 306 on the substrate 300 is set as a projection (c), the projection of the first sub-pixel electrode 3021 on the substrate 300 is set as a projection (d), and the projection (c) is coincident with the projection (d).

Optional, as shown in FIG. 3, the first color conversion layer 306 includes two sub-color conversion layers which are disposed at a same layer and the two sub-color conversion layers are the first sub-color conversion layer 3061 and the second sub-color conversion layer 3062 respectively.

Optional, as shown in FIG. 3, the first sub-pixel electrode 3021 further comprises a third sub-pixel electrode 30211 and a fourth sub-pixel electrode 30212.

Optional, the first sub-color conversion layer 3061 is aligned to the third sub-pixel electrode 30211, and the second sub-color conversion layer 3062 is aligned to the third sub-pixel electrode 30212.

Optional, the first sub-color conversion layer 3061 is a red color conversion layer, and the corresponding emission light is red light. The second sub-color conversion layer 3062 is a green color conversion layer, and the corresponding emission light is green light. Of course, the first sub-color conversion layer 3061 and the second sub-color conversion layer 3062 can be a conversion layer in other colors, as long as they can emit light under the stimulation of at least one of the first emission light and the second emission light. The region aligned to the second sub-pixel electrode 3022 is not provided with any color conversion layers, the light emitted from the corresponding region is blue light.

A certain voltage is applied between the first electrode layer 301 and the second electrode layer 302, then the first light emitting layer 303 emits blue light and the second light emitting layer 304 emits blue light or light blue light, the corresponding emission light irradiates to the red conversion layer 3061 and the green conversion layer 3062 to emit red light and green light respectively, the region aligned to the second sub-pixel electrode 3022 emits blue light directly, the intensity of light in different colors can be controlled by adjusting the voltage on the pixel electrodes 30211, 30212 and 3022, thus the full color display can be achieved.

Figure 4:
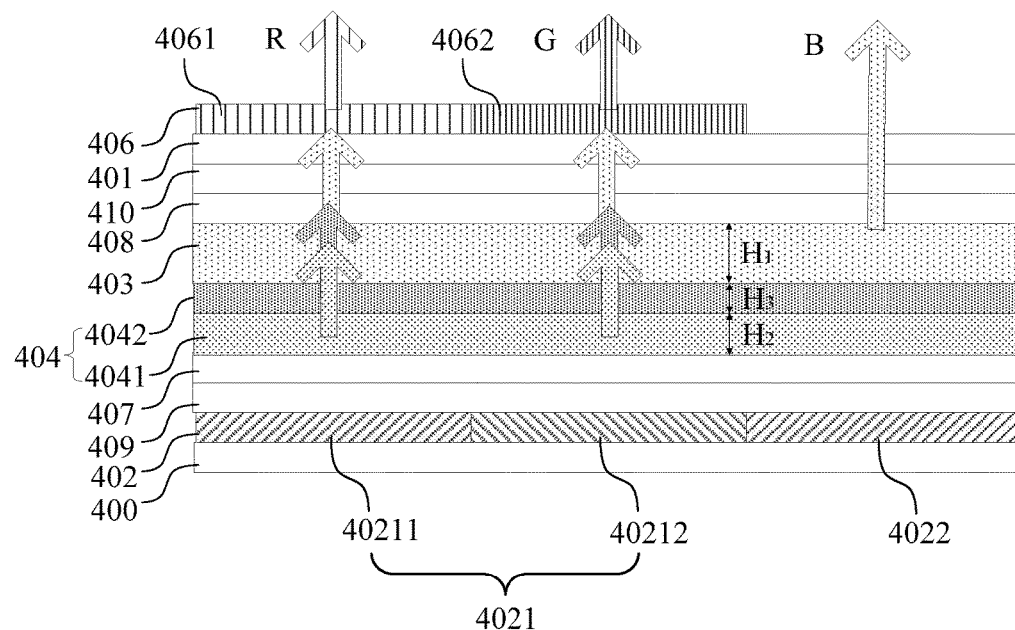
FIG. 4 is a schematic structure schematic diagram of a top emission OLED with two light emitting layers and the second light emitting layer having two sub-layers provided by an embodiment of the present disclosure.

As shown in FIG. 4, an OLED device provided by another embodiment of the present disclosure comprises a substrate 400 and a second electrode layer 402, a hole injection layer 409, a hole transport layer 407, a second light emitting layer 404, a first light emitting layer 403, an electron transport layer 408, an electron injection layers 410, a first electrode layer 401 and a first color conversion layer 406 that are sequentially formed on the substrate 400. The structure of this device is the same as that of the device shown in FIG. 3; the difference is that the position relation of two sub-layers 4041 and 4042 in the second light emitting layer 404 is opposite to the structure shown in FIG. 3. In the structure shown in FIG. 4, the sub-layer 4042 emitting white light is disposed adjacent to the first light emitting layer 403.

Figure 5:
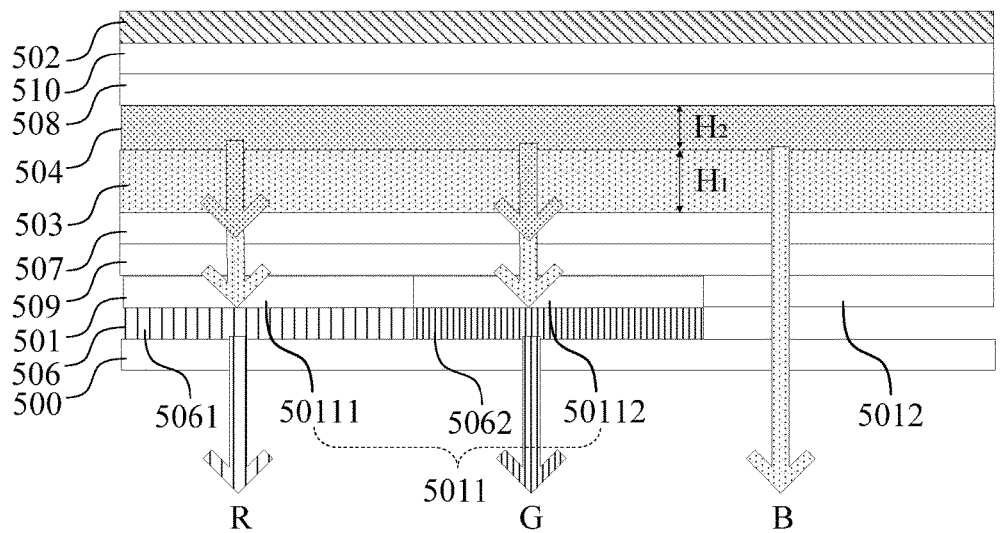
FIG. 5 is a schematic structure diagram of a bottom emission OLED with two light emitting layers provided by an embodiment of the present disclosure.

As shown in FIG. 5, an OLED device provided by another embodiment of the present disclosure includes a substrate 500 and a first color conversion layer 506, a first electrode layer 501, a hole injection layer 509, a hole transport layer 507, a first light emitting layer 503, a second light emitting layer 504, an electron transport layer 508, an electron injection layer 510 and a second electrode layer 502 that are sequentially formed on the substrate 500. The device shown in FIG. 5 is a bottom emitting device comprising two light emitting layers.

Figure 6:
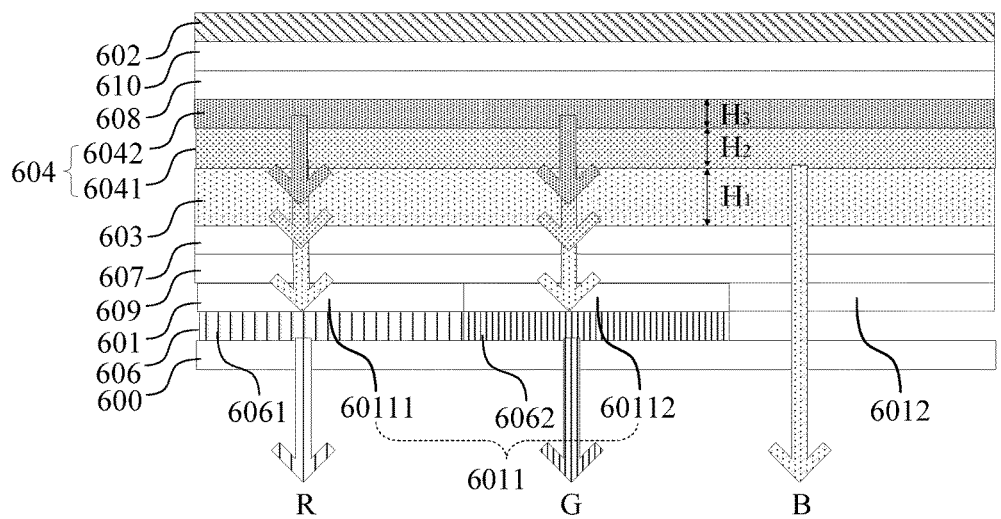
FIG. 6 is a schematic structure schematic diagram of a bottom emission OLED with two light emitting layers and the second light emitting layer having two sub-layers provided by an embodiment of the present disclosure.

As shown in FIG. 6, an OLED device provided by another embodiment of the present disclosure comprises a substrate 600 and a first color conversion layer 606, a first electrode layer 601, a hole injection layer 609, a hole transport layer 607, a first light emitting layer 603, a second light emitting layer 604, an electron transport layer 608, an electron injection layer 610 and a second electrode layer 602 that are sequentially formed on the substrate 600, wherein the second light emitting layer 604 further includes two sub-layers 6041 and 6042. The sub-layer 6041 emits white light, the sub-layer 6042 emits blue light, or the sub-layer 6041 emits blue light, the sub-layer 6042 emits white light. The device shown in FIG. 6 is a bottom emitting device including two light emitting layers wherein the second light emitting layer comprising two sub-layers.

Figure 7:
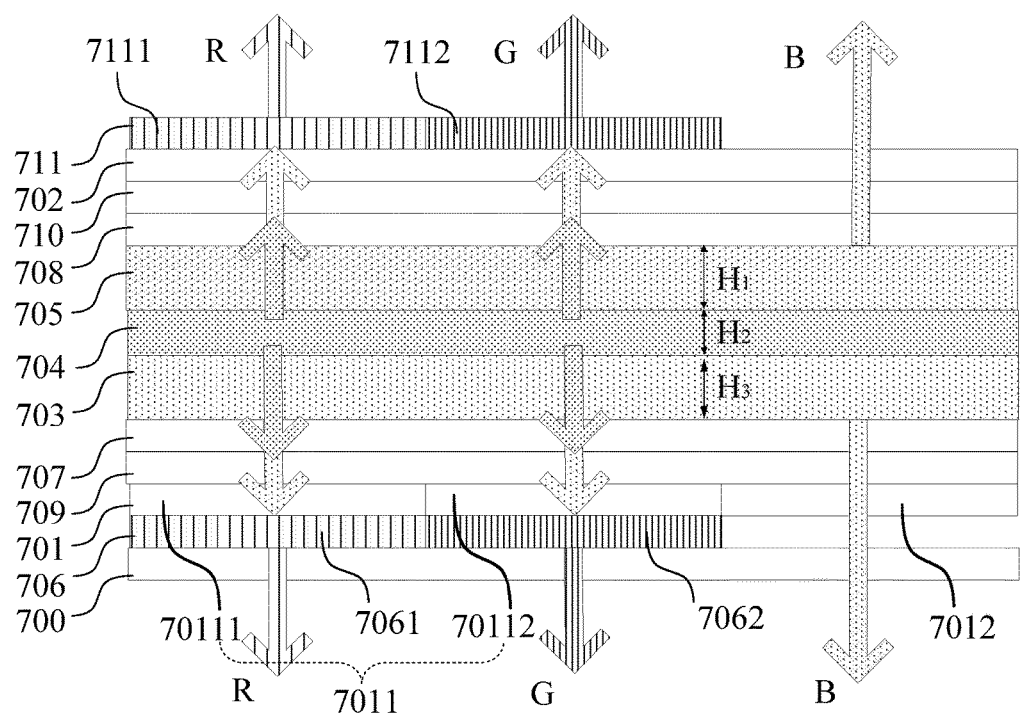
FIG. 7 is a schematic structure schematic diagram of a double side emission OLED with three light emitting layers provided by an embodiment of the present disclosure.

As shown in FIG. 7, an OLED device provided by another embodiment of the present disclosure includes a substrate 700 and a first color conversion layer 706, a first electrode layer 701, a hole injection layer 709, a hole transport layer 707, a first light emitting layer 703, a second light emitting layer 704, an electron transport layer 708, an electron injection layer 710, a second electrode layer 702 and a second color conversion layer 711 that are sequentially formed on the substrate 700. The device shown in FIG. 7 is a double side emission OLED device with three light emitting layers. Both the first light emitting layer 703 and the third light emitting layer 705 emit blue light, they can adopt the same light emitting material, or adopt different light emitting materials. As the first light emitting layer 703 is closer to the first color conversion layer 706, the first emission light mainly stimulates the light emitting substance in the first color conversion layer 706. In the same way, as the third light emitting layer 705 is closer to the second color conversion layer 711, the third emission light mainly stimulates the light emitting substance in the second color conversion layer 711. The second light emitting layer 704 can emit blue light or white light, as long as the peak wavelength of the second emission light is larger than that of the first light emitting layer 703 in the blue light region, and the peak wavelength is larger than that of the second light emitting layer 704 in the blue light region. As the peak wavelength of the emission light of the second light emitting layer 704 in the blue light region is longer, the second light emitting layer has a longer luminescence lifetime, thus the lifetime of the OLED device is increased.

The light emitting layer material in the embodiments of the present disclosure can be selected according to the different light emitting colors of the light emitting layer material. Besides, according to the requirements, organic light-emitting materials in the embodiments of the present disclosure include fluorescent materials or phosphorescence materials, and at present usually use an adopt-mixed system, that is the usable light-emitting materials are obtained by adding the doping materials to the main light-emitting materials. For example, metal complex materials, derivatives of anthracene, aromatic diamine compounds, triphenylamine compounds, aromatic triamine compounds, biphenyl diamine derivatives, or triarylamines polymers, etc. can be used as the main light-emitting materials; More specifically, for example, aluminum (III) bis(2-methyl-8-quninolinato)-4-phenylphenolate (Balq), 9,10-di(2-naphthyl) anthracene (ADN), TAZ, 4,4'-bis(N-carbazolyl)-1,1'-biphenyl (CBP), MCP, 4,4',4''-tris(carbazol-9-yl) triphenylamine (TCTA) or N,N'-diphenyl-N,N'-bis(1-naphthyl)-(1,1'-biphenyl)-4,4'-diamine (NPB), etc. The fluorescent light-emitting materials or the doping materials, for example, include coumarin dyes (coumarin 6, C-545-T), quinacridone (DMQA), or 4-(dinitrile methylene)-2-methyl-6-(4-dimethylamino-styrene)-4H-pyran (DCM) series, etc. The phosphorescence light-emitting materials or the doping materials, for example, include the metal complex luminescence materials based on the Ir, Pt, Ku, Cu metal, etc. For example: Flrpic, Fir6, FirN4, Flrtaz, Ir(ppy)$_3$, Ir(ppy)$_2$ (acac), PtOEP, (btp)$_2$Iracac, Ir(piq)$_2$(acac) or (MDQ)$_2$Iracac and so on. Besides, the light-emitting materials can also include the double main body and doping material.

The hole injection layer in the embodiments of the present disclosure, for example can be made of triphenylamine compounds or organic layers with p-type doping or polymers, for example: tri[4-(5-phenyl-2-thiophene) phenyl] amine, 4,4',4''-tri[2-naphthyl (phenyl) amino] triphenylamine (2-TNATA) or 4,4',4''-tri(3-methyl phenyl aniline) triphenylamine (m-MTDATA), copper phthalocyanine (CuPc), Pedot:Pss, TPD, or F4TCNQ.

The hole transport layer in the embodiments of the present disclosure, for example can be made of aromatic diamine compounds, triphenylamine compounds, aromatic triamine compounds, biphenyl diamine derivatives, triarylamine polymers and carbazole polymers. Such as NPB, TPD, TCTA and polyethylene carbazole or its monomer.

The electron transport layer in the embodiments of the present disclosure, for example can be made of phenanthroline derivatives, oxazole derivatives, thiazole derivatives, imidazole derivatives, metal complexes and anthracene derivatives. The specific examples include: 8-hydroxyquinoline aluminum (Alq$_3$), 8-hydroxyquinoline lithium (Liq), 8-hydroxyquinoline gallium, double[2-(2-hydroxyl phenyl-1)-pyridine] beryllium, 2-(4-diphenyl)-5-(4-tert-butylbenzene)-1,3,4 oxadiazoles(PBD), 1,3,5-tri(N-phenyl-2-benzimidazole-2) benzene (TPBI), BCP, Bphen, etc.

The electron injection layer in the embodiments of the present disclosure, for example can be made of alkali metal oxides, alkali metal fluorides, etc. The alkali metal oxide includes lithium oxide (Li$_2$O), lithium boron oxide (LiBO), potassium silicate (K$_2$SiO$_3$), cesium carbonate (Cs$_2$CO$_3$), etc. The alkali metal fluoride includes lithium fluoride (LiF) and sodium fluoride (NaF), etc.

What are described above is related to the illustrative embodiments of the disclosure only and not limitative to the scope of the disclosure; the scopes of the disclosure are defined by the accompanying claims.

The present application claims the priority of the Chinese Patent Application No. 201510415378.2 filed on Jul. 15, 2015, the entirety of which is incorporated herein by reference as a part of the present application.

What is claimed is:

1. An organic light emitting device, comprising:
   a substrate,
   a first electrode layer, a second electrode layer, a first color conversion layer, a first light emitting layer and a second light emitting layer which are stacked on the substrate, wherein,
   the first light emitting layer is disposed between the first electrode layer and the second electrode layer, the first light emitting layer emits first emission light under electrical excitation;
   the first electrode layer is a transparent electrode layer, the first color conversion layer is disposed at one side of the first electrode layer away from the second electrode layer;
   the second light emitting layer is disposed between the first light emitting layer and the second electrode layer, the second light emitting layer emits second emission light under electrical excitation; and
   a peak wavelength of the second emission light in a blue light region is larger than a peak wavelength of the first emission light in the blue light region;
   wherein the first emission light and the second emission light are both blue light;
   a thickness of the first emitting layer is larger than a thickness of the second light emitting layer; and
   a distance from the first light emitting layer to the first color conversion layer is smaller than a distance from the second light emitting layer to the first color conversion layer.

2. The organic light emitting device according to claim 1, wherein the first emission light is blue light, the second light emitting layer comprises two sub-layers, one sub-layer emits the blue light, and the other sub-layer emits white light.

3. The organic light emitting device according to claim 1, further comprising a third light emitting layer and a second color conversion layer,
   wherein the second electrode layer is a transparent electrode layer, and the second color conversion layer is disposed at one side of the second electrode layer away from the first electrode layer;
   the third emitting layer is disposed between the second light emitting layer and the second electrode layer, the third light emitting layer emits third emission light under electric excitation, and the peak wavelength of the second emission light in the blue light region is larger than a peak wavelength of the third emission light in the blue light region.

4. The organic light emitting device according to claim 3, wherein the third emission light is blue light, and the peak wavelength of the third emission light in the blue light region is approximately equal to the peak wavelength of the first emission light in the blue light region.

5. The organic light emitting device according to claim 1, wherein the peak wavelength of the first emission light in the blue light region is from 420 nm to 470 nm, and the peak wavelength of the second emission light in the blue light region is from 450 nm to 500 nm.

6. The organic light emitting device according to claim 3, wherein the peak wavelength of the first emission light in the blue light region is from 420 nm to 470 nm, the peak wavelength of the second emission light in the blue light region is from 450 nm to 500 nm, and the peak wavelength of the third emission light in the blue light region is from 420 nm to 470 nm.

7. The organic light emitting device according to claim 1, wherein the second electrode layer is a reflective electrode layer, the second electrode layer is disposed at one side close to the substrate, and the first electrode layer is disposed at one side away from the substrate.

8. The organic light emitting device according to claim 1, wherein the second electrode layer is a reflective electrode layer, the first electrode layer is disposed at one side close to the substrate, and the second electrode layer is disposed at one side away from the substrate.

9. The organic light emitting device according to claim 1,
wherein one of the first electrode layer and the second electrode layer comprises a first sub-pixel electrode and a second sub-pixel electrode that are disposed in a same layer, and the first color conversion layer is disposed in a region aligned to the first sub-pixel electrode.

10. The organic light emitting device according to claim 9, wherein the first sub-pixel electrode further comprises a third sub-pixel electrode and a fourth sub-pixel electrode that are disposed in a same layer,
the first color conversion layer comprises a first sub-color conversion layer and a second sub-color conversion layer that are disposed in a same layer, the first sub-color conversion layer is aligned to the third sub-pixel electrode, and the second sub-color conversion layer is aligned to the fourth sub-pixel electrode.

11. The organic light emitting device according to claim 10, wherein the first sub-color conversion layer is a red conversion layer and the second sub-color conversion layer is a green conversion layer.

12. The organic light emitting device according to claim 3, wherein one of the first electrode layer and the second electrode layer comprises a first sub-pixel electrode and a second sub-pixel electrode that are disposed in a same layer, and
the first color conversion layer and the second color conversion layer are disposed in a region aligned to the first sub-pixel electrode.

13. The organic light emitting device according to claim 12, wherein the first sub-pixel electrode further comprises a third sub-pixel electrode and a fourth sub-pixel electrode that are disposed in a same layer,
at least one of the first color conversion layer and the second color conversion layer comprises a first sub-color conversion layer and a second sub-color conversion layer which are disposed in a same layer, the first sub-color conversion layer is aligned to the third sub-pixel electrode, and the second sub-color conversion layer is aligned to the fourth sub-pixel electrode.

14. The organic light emitting device according to claim 13, wherein the first sub-color conversion layer is a red conversion layer and the second sub-color conversion layer is a green conversion layer.

15. The organic light emitting device according to claim 1, further comprising at least one layer disposed between the first electrode layer and the second electrode layer, and the at least one layer is selected from a hole injection layer, a hole transport layer, a hole blocking layer, an electron transport layer, an electron injection layer and an electron blocking layer.

* * * * *